(12) United States Patent
Standaert et al.

(10) Patent No.: US 8,592,263 B2
(45) Date of Patent: Nov. 26, 2013

(54) FINFET DIODE WITH INCREASED JUNCTION AREA

(75) Inventors: Theodorus Eduardus Standaert, Albany, NY (US); Kangguo Cheng, Albany, NY (US); Balasubramanian S. Haran, Albany, NY (US); Shom Ponoth, Albany, NY (US); Tenko Yamashita, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/456,921

(22) Filed: Apr. 26, 2012

(65) Prior Publication Data

US 2013/0285208 A1  Oct. 31, 2013

(51) Int. Cl.
*H01L 21/84* (2006.01)

(52) U.S. Cl.
USPC .................... 438/157; 438/284; 257/E21.362

(58) Field of Classification Search
USPC .................. 438/284, 418, 419; 257/E21.362, 257/E21.442
See application file for complete search history.

(56) References Cited

U.S. PATENT DOCUMENTS

| 6,262,873 | B1 | 7/2001 | Pequignot et al. |
| 6,399,996 | B1 | 6/2002 | Chang et al. |
| 6,998,694 | B2 | 2/2006 | Wu |
| 7,064,408 | B2 | 6/2006 | Wu |
| 7,098,510 | B2 | 8/2006 | Kodama et al. |
| 7,145,204 | B2 | 12/2006 | Duvvury et al. |
| 7,700,449 | B2 * | 4/2010 | Lee ............................... 438/299 |
| 7,964,893 | B2 | 6/2011 | Lee |
| 8,080,838 | B2 * | 12/2011 | Chang et al. .................. 257/288 |

FOREIGN PATENT DOCUMENTS

JP  2000031505  1/2000

* cited by examiner

*Primary Examiner* — Chandra Chaudhari
(74) *Attorney, Agent, or Firm* — Joseph P. Abate; Howard M. Cohn

(57) ABSTRACT

A FinFET diode and method of fabrication are disclosed. In one embodiment, the diode comprises, a semiconductor substrate, an insulator layer disposed on the semiconductor substrate, a first silicon layer disposed on the insulator layer, a plurality of fins formed in a diode portion of the first silicon layer. A region of the first silicon layer is disposed adjacent to each of the plurality of fins. A second silicon layer is disposed on the plurality of fins formed in the diode portion of the first silicon layer. A gate ring is disposed on the first silicon layer. The gate ring is arranged in a closed shape, and encloses a portion of the plurality of fins formed in the diode portion of the first silicon layer.

11 Claims, 16 Drawing Sheets

US 8,592,263 B2

FINFET DIODE WITH INCREASED JUNCTION AREA

FIELD OF THE INVENTION

The present invention relates generally to semiconductor fabrication, and more particularly, to a FinFET diode and method of fabrication.

BACKGROUND OF THE INVENTION

Extremely high voltages can develop in the vicinity of an integrated circuit due to the build-up of static charges. A high potential may be generated to an input or output buffer of the integrated circuit, which may be caused, for example, by a person touching a package pin that is in electrical contact with the input or output buffer. When the electrostatic charges are discharged, a high current is produced at the package nodes of the integrated circuit, and is referred to as electrostatic discharge (ESD).

ESD is becoming a serious problem for semiconductor devices as the demand for higher operating speed, smaller operating voltages, higher packing density and reduced cost drives a reduction of all device dimensions. This generally implies thinner dielectric layers, higher doping levels with more abrupt doping transitions, and higher electric fields—all factors that contribute to an increased sensitivity to damaging ESD events.

FinFET technology is becoming more prevalent as device size continues to shrink. It is therefore desirable to have an improved structure and fabrication process for forming ESD-tolerant devices compatible with the formation of FinFET structures.

SUMMARY

In one embodiment, a method of forming a diode on a semiconductor structure is provided. The structure is comprised of a first silicon layer disposed on an insulator layer. The method comprises forming a plurality of diode fins on a diode portion of the semiconductor structure, wherein the plurality of fins terminate on the first silicon layer, implanting dopants on the plurality of diode fins and first silicon layer, forming a gate ring on the semiconductor structure, forming a second silicon layer, disposed within the gate ring, and on the plurality of diode fins, and doping the second silicon layer oppositely to the first silicon layer.

In another embodiment, a semiconductor structure is provided. The semiconductor structure comprises, a semiconductor substrate, an insulator layer disposed on the semiconductor substrate, a first silicon layer disposed on the insulator layer, a plurality of fins formed in a diode portion of the first silicon layer, wherein a region of the first silicon layer is disposed adjacent to each of the plurality of fins, a second silicon layer disposed on the plurality of fins formed in the diode portion of the first silicon layer, and a gate ring disposed on the first silicon layer, wherein the gate ring is arranged in a closed shape, and encloses a portion of the plurality of fins formed in the diode portion of the first silicon layer.

In another embodiment, a semiconductor structure is provided. The semiconductor structure comprises a first silicon layer, a plurality of recesses formed in the first silicon layer, wherein the depth of each of the plurality of recesses is less than the depth of the first silicon layer, wherein an un-recessed area between each of the plurality of recesses forms a fin, thereby forming a plurality of fins, a second silicon layer disposed on the first silicon layer, wherein contact surface area between the first silicon layer and second silicon layer is greater than the surface area of the plurality of fins, and a gate ring disposed on the first silicon layer, wherein the gate ring is arranged in a closed shape, and encloses a portion of the plurality of fins.

BRIEF DESCRIPTION OF THE DRAWINGS

The structure, operation, and advantages of the present invention will become further apparent upon consideration of the following description taken in conjunction with the accompanying figures (FIGs.). The figures are intended to be illustrative, not limiting.

Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity.

Figure 1:
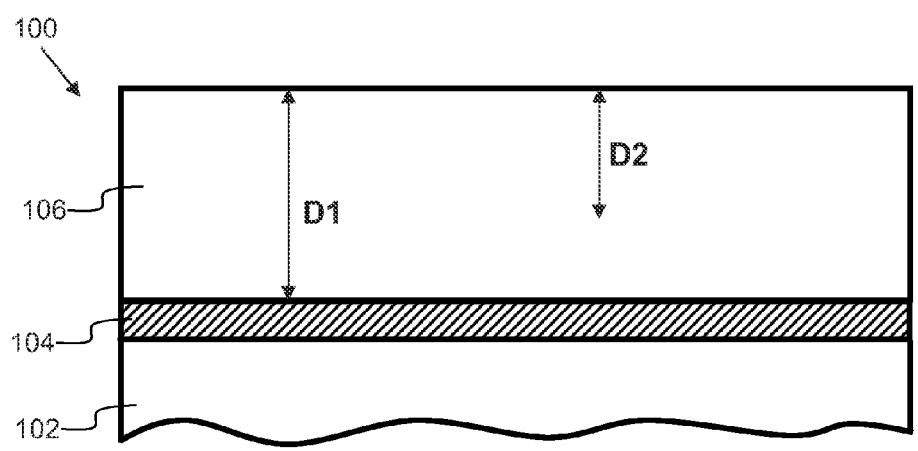

Often, similar elements may be referred to by similar numbers in various figures (FIGs) of the drawing, in which case typically the last two significant digits may be the same, the most significant digit being the number of the drawing figure (FIG). Furthermore, for clarity, some reference numbers may be omitted in certain drawings.

FIG. 1 shows a starting point for a method in accordance with an embodiment of the present invention.

Figure 2:
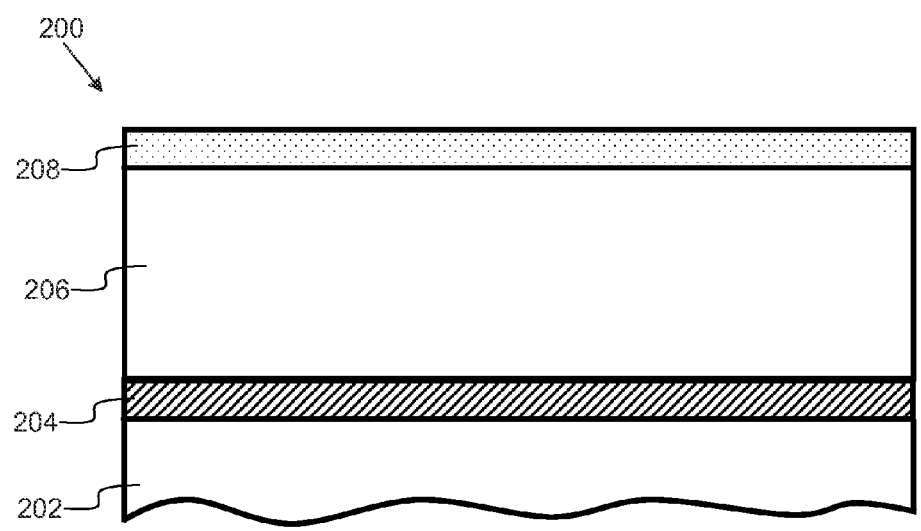

FIG. 2 shows a subsequent process step of applying a nitride layer.

Figure 3:
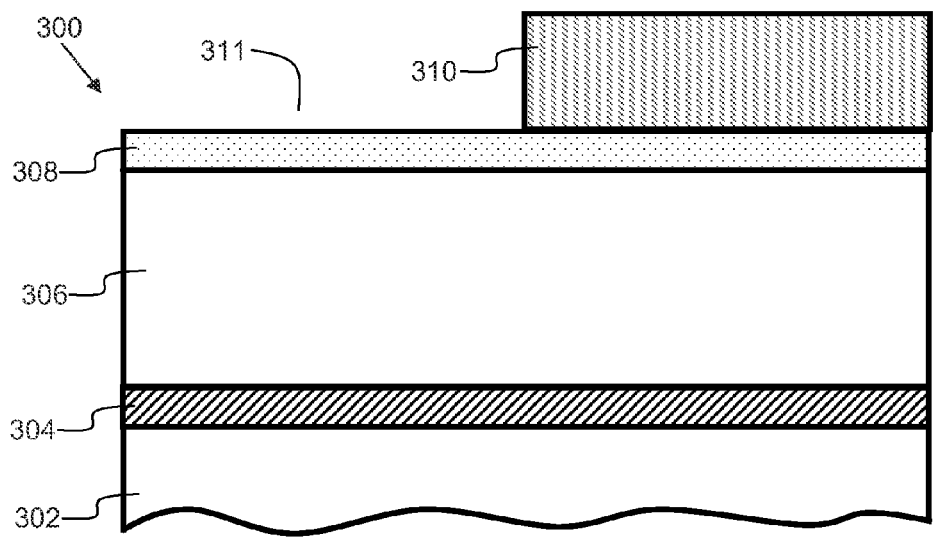

FIG. 3 shows a subsequent process step of applying resist to the diode region.

Figure 4:
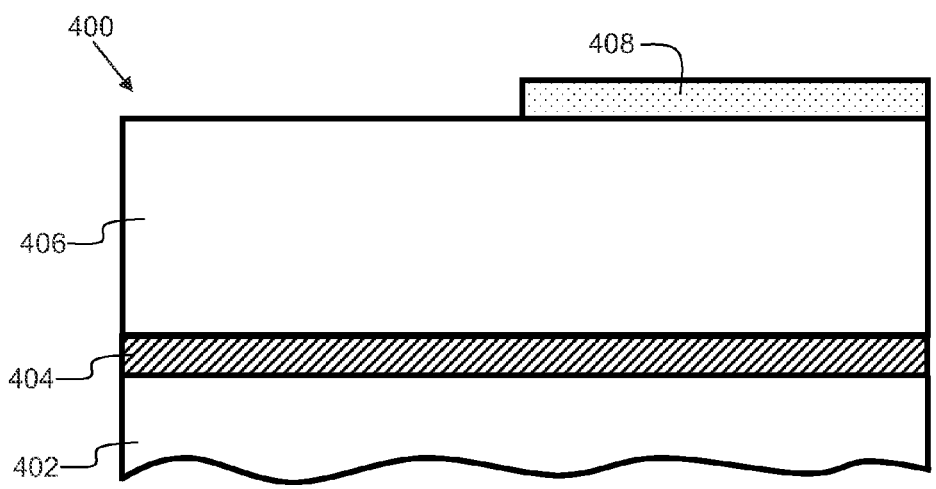

FIG. 4 shows a subsequent process step of etching and removing resist from the non-diode region.

Figure 5:
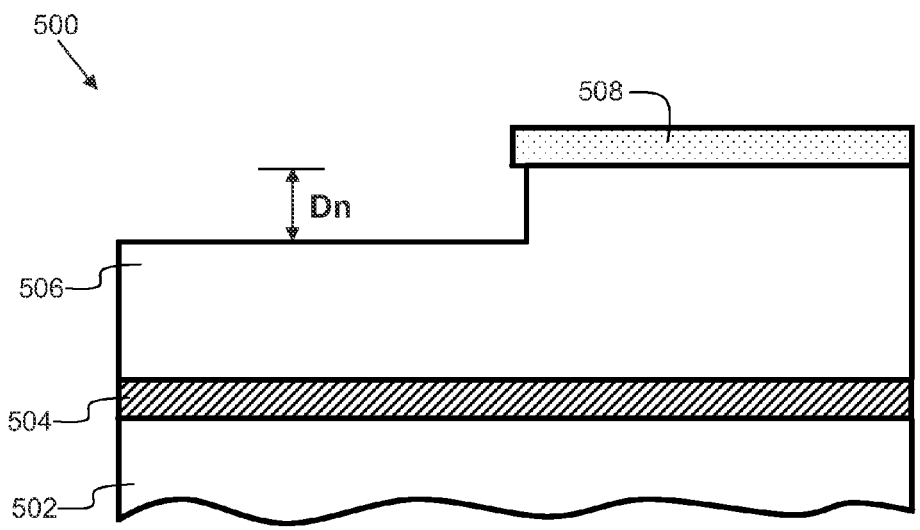

FIG. 5 shows a subsequent process step of recessing the non-diode region.

Figure 6:
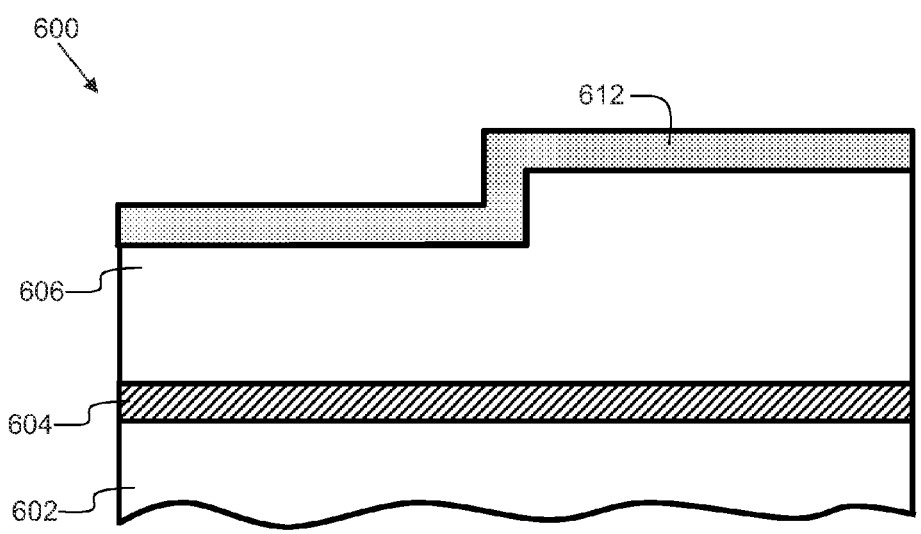

FIG. 6 shows a subsequent process step of applying a fin-top protective layer.

Figure 7:
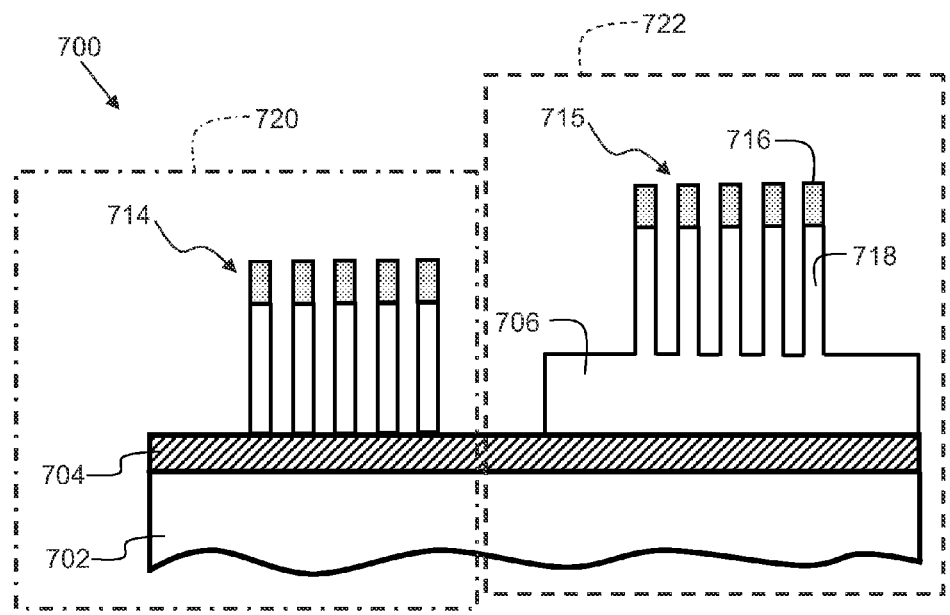

FIG. 7 shows a subsequent process step of fin formation.

Figure 8:
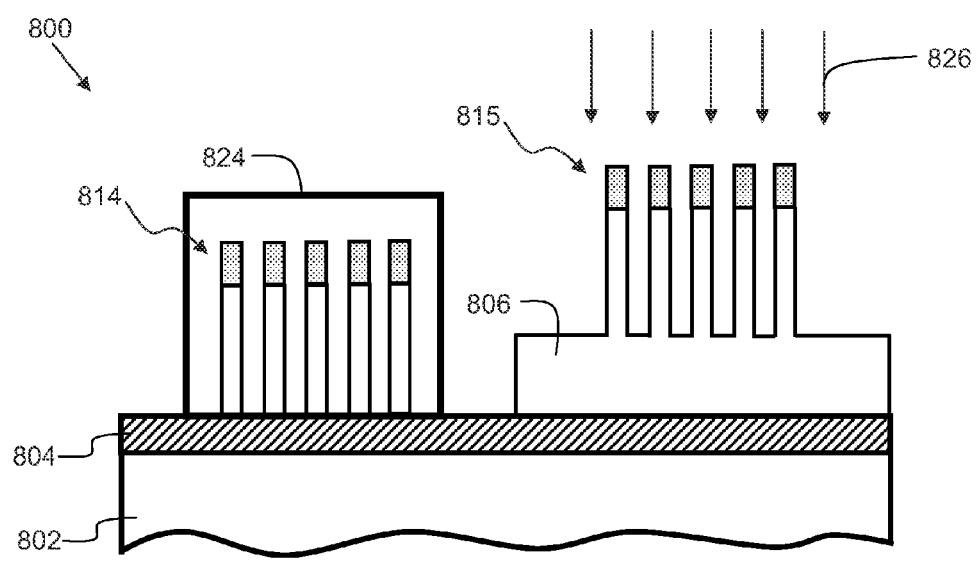

FIG. 8 shows a subsequent process step of diode implantation.

Figure 9A:
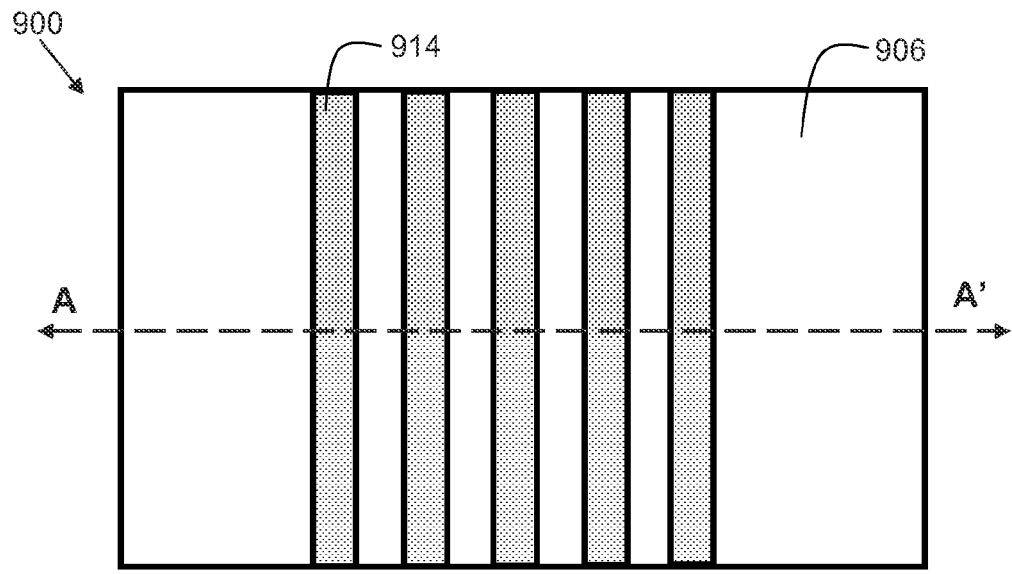

FIG. 9A shows a top down view of the diode region after fin formation.

Figure 9B:
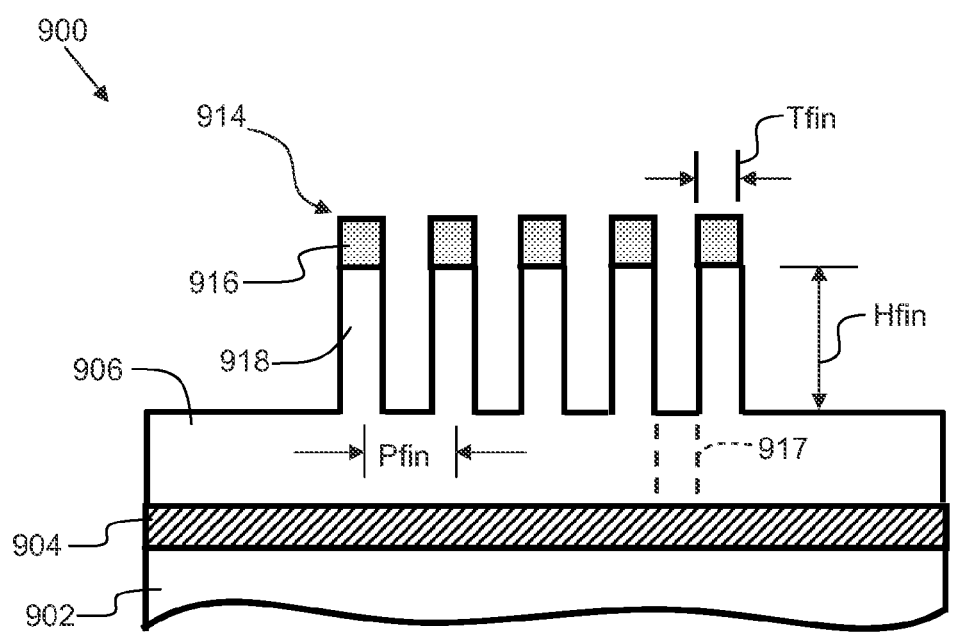

FIG. 9B shows a cross section of the diode region along the line indicated in FIG. 9A.

Figure 10A:
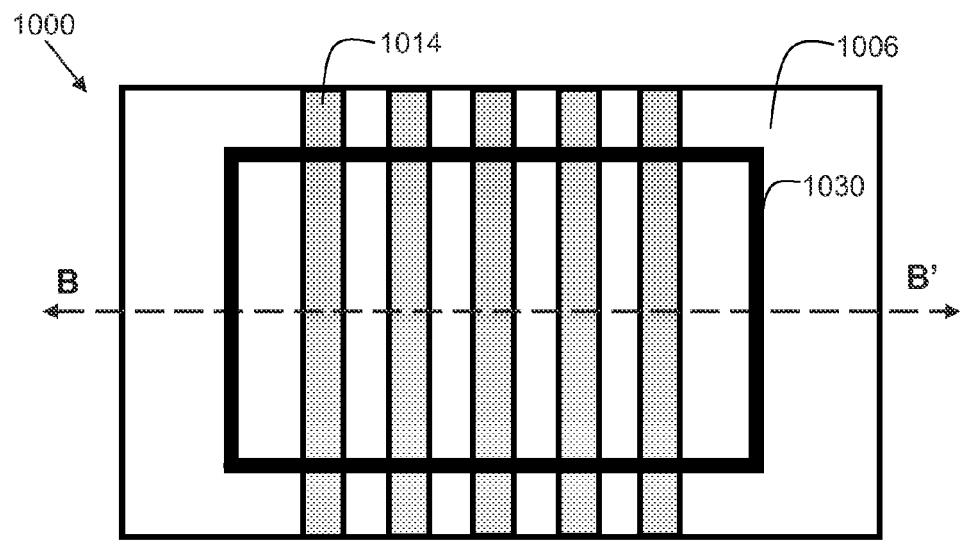

FIG. 10A shows a top-down view after a subsequent process step of gate ring formation.

Figure 10B:
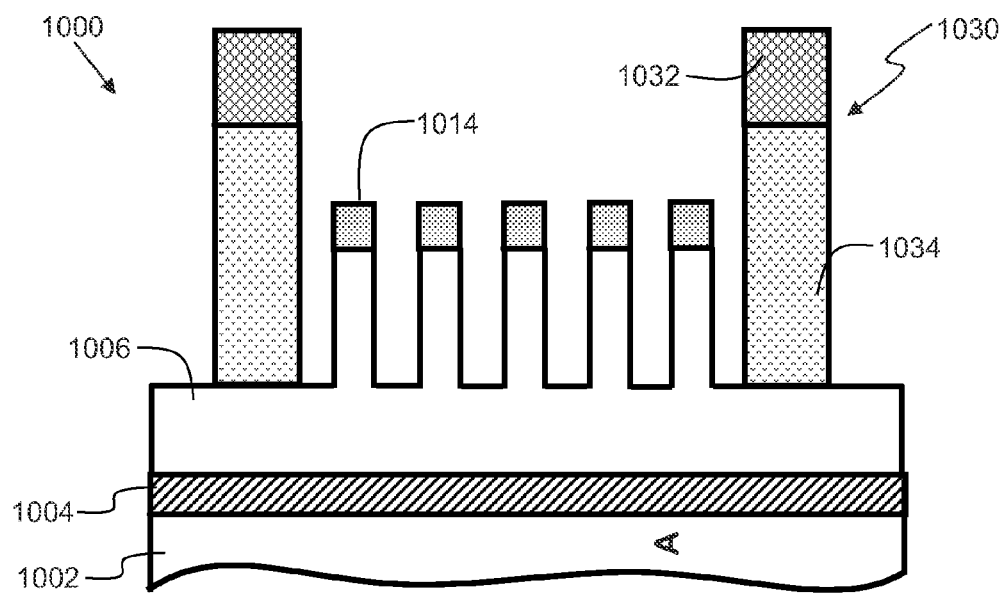

FIG. 10B shows a cross section view of the diode region along the line indicated in

FIG. 10A.

Figure 11:
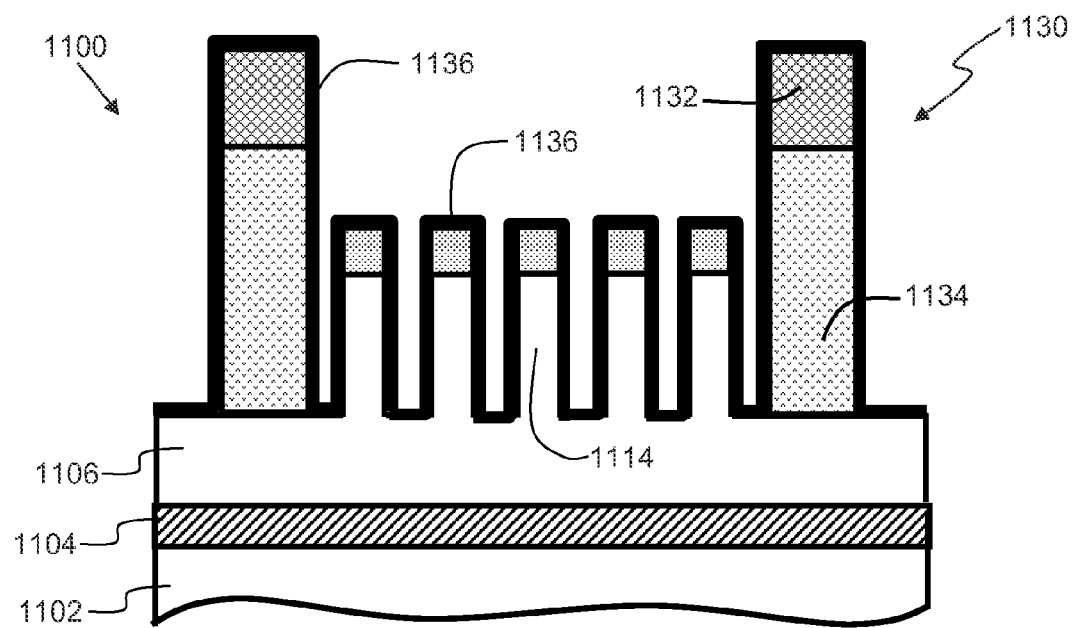

FIG. 11 shows a subsequent process step of spacer deposition.

Figure 12A:
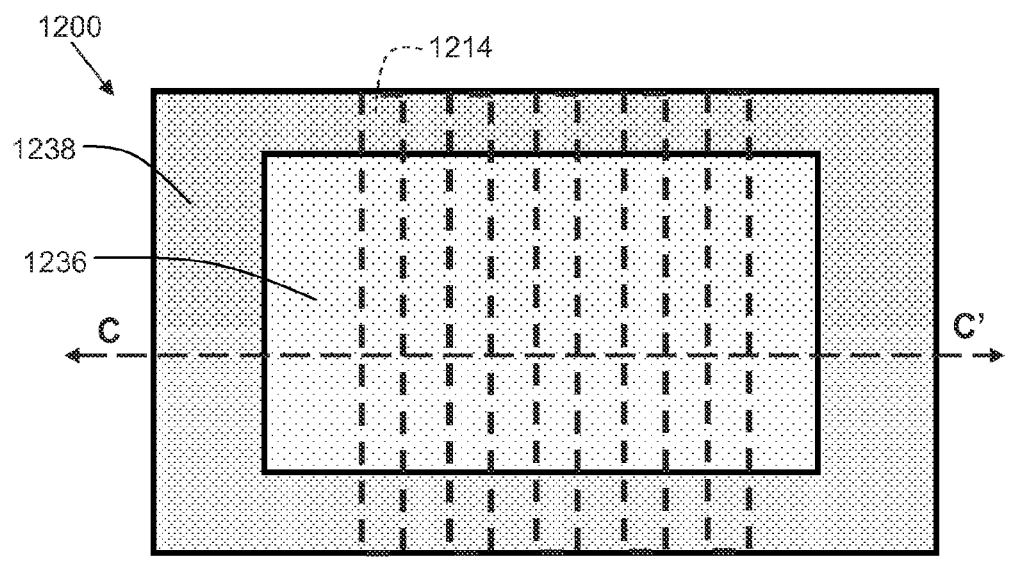

FIG. 12A shows a top-down view after a subsequent process step of applying a block mask.

Figure 12B:
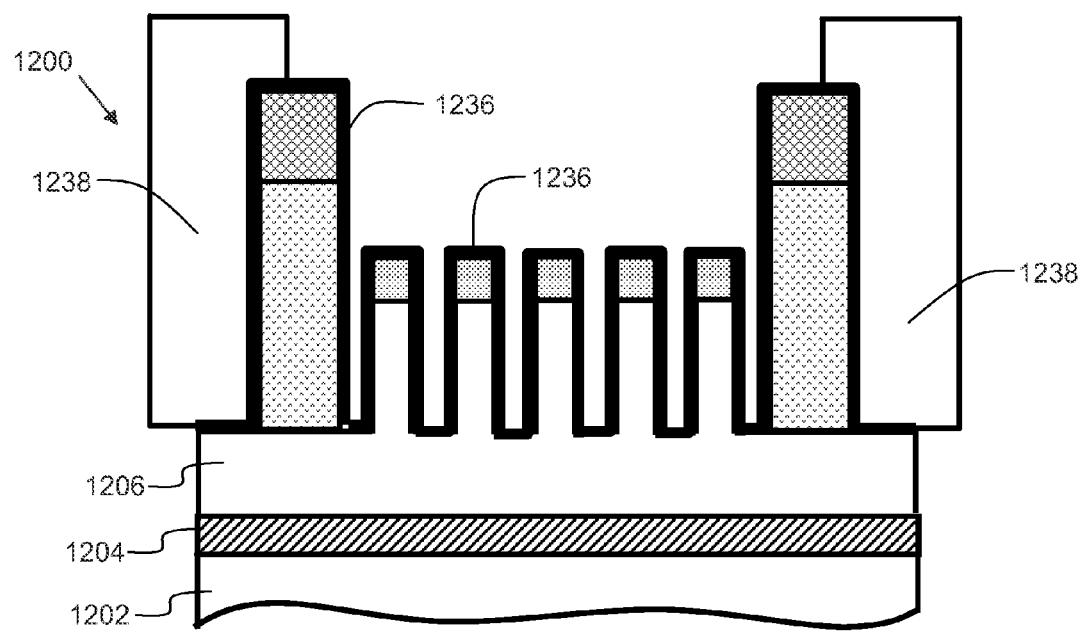

FIG. 12B shows a cross section view of the diode region along the line indicated in

FIG. 12A.

Figure 13:
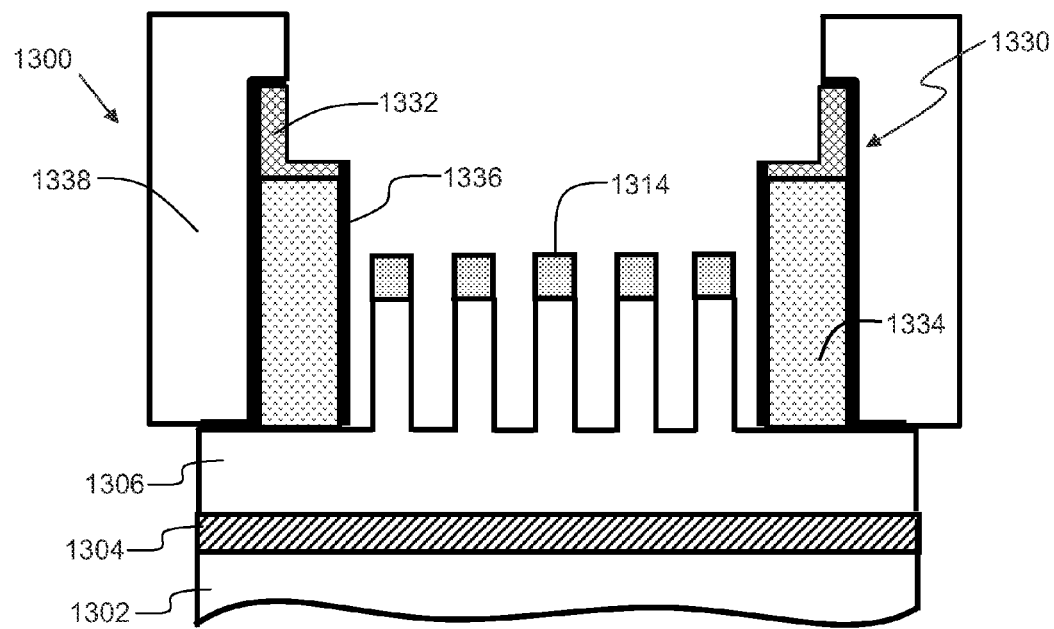

FIG. 13 shows a subsequent process step of fin spacer removal.

Figure 14:
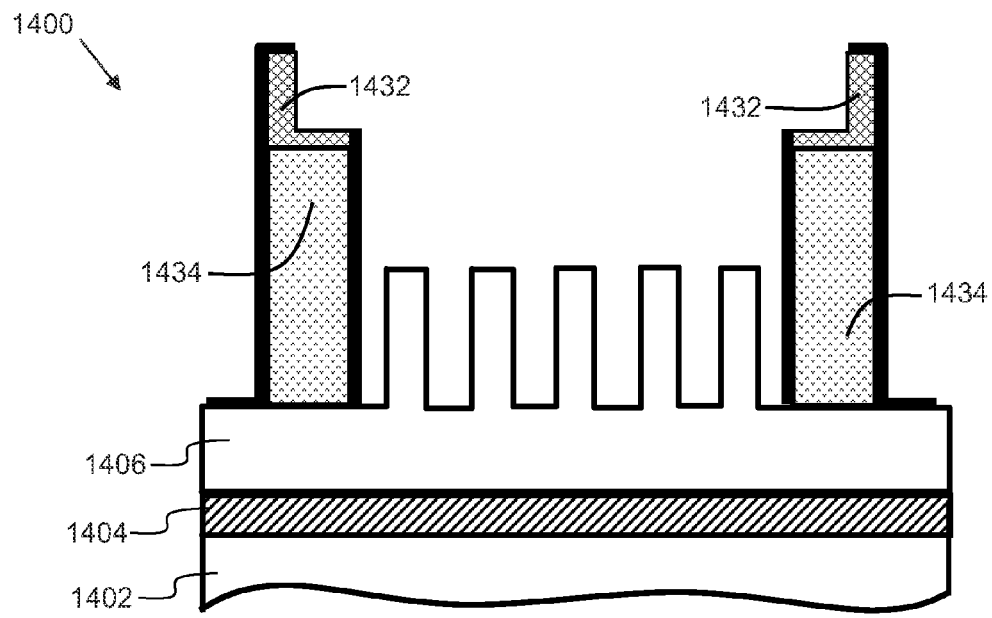

FIG. 14 shows a subsequent process step of block mask removal.

Figure 15A:
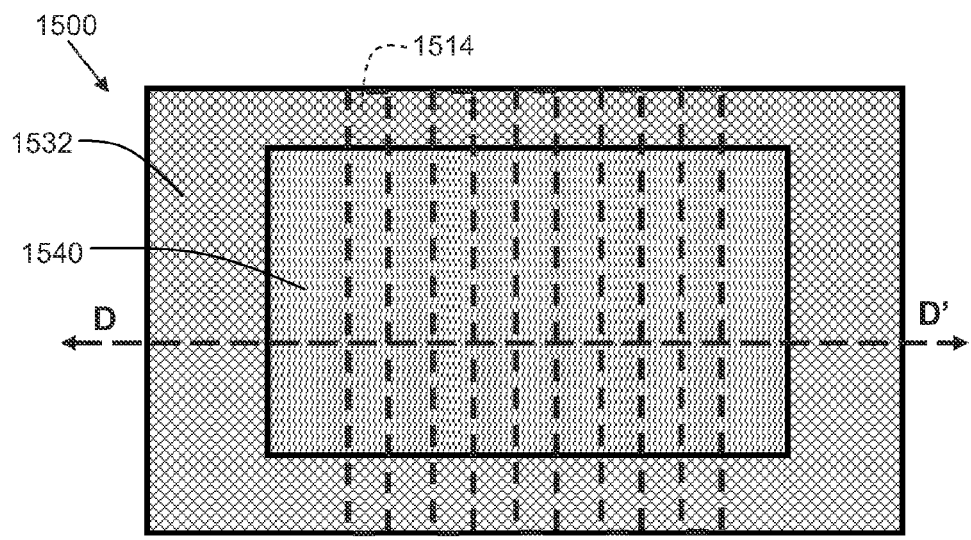

FIG. 15A shows a top-down view after a process step of second silicon layer formation.

Figure 15B:
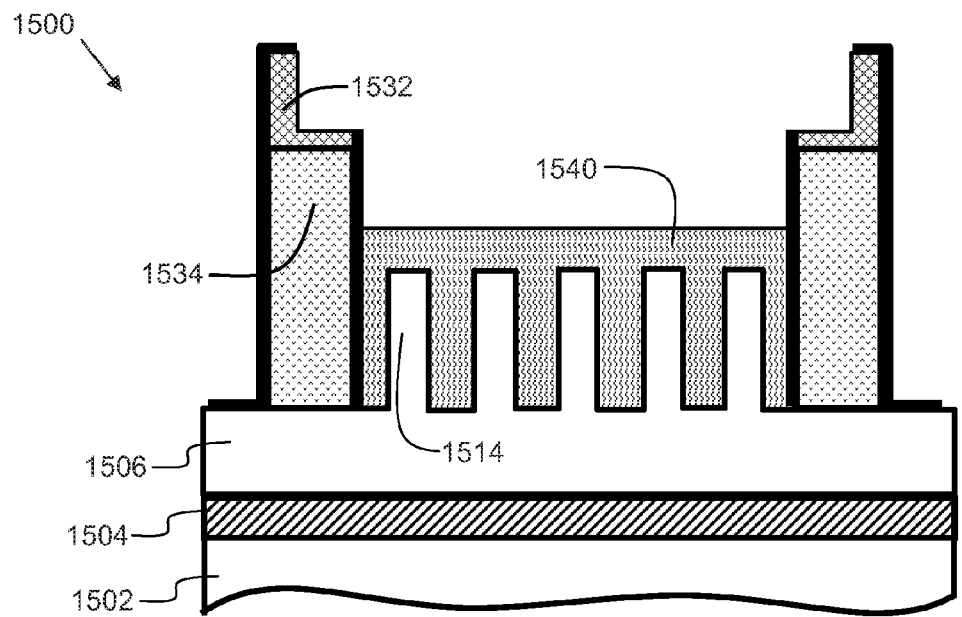

FIG. 15B shows a cross section view of the diode region along the line indicated in

FIG. 15A.

Figure 16:
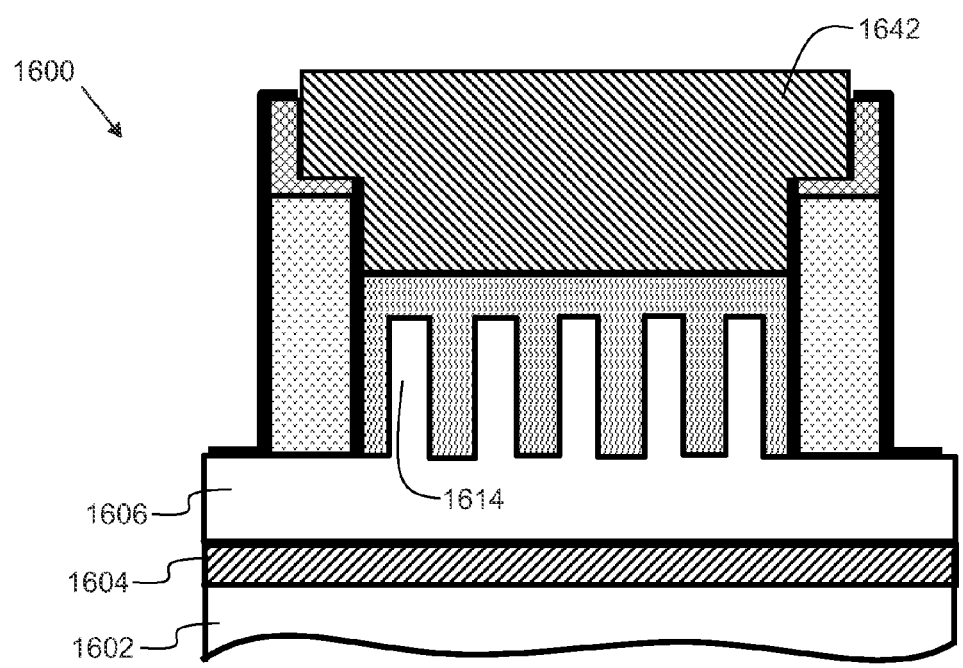

FIG. 16 shows a subsequent process step of diode masking.

Figure 17:
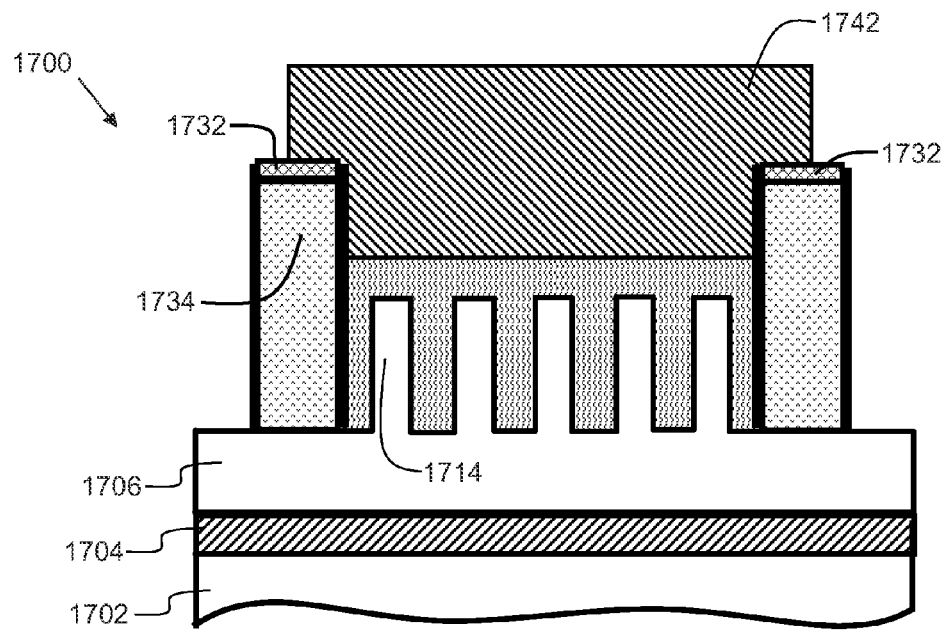

FIG. 17 shows a subsequent process step of spacer etch outside the gate ring (leveling).

Figure 18:
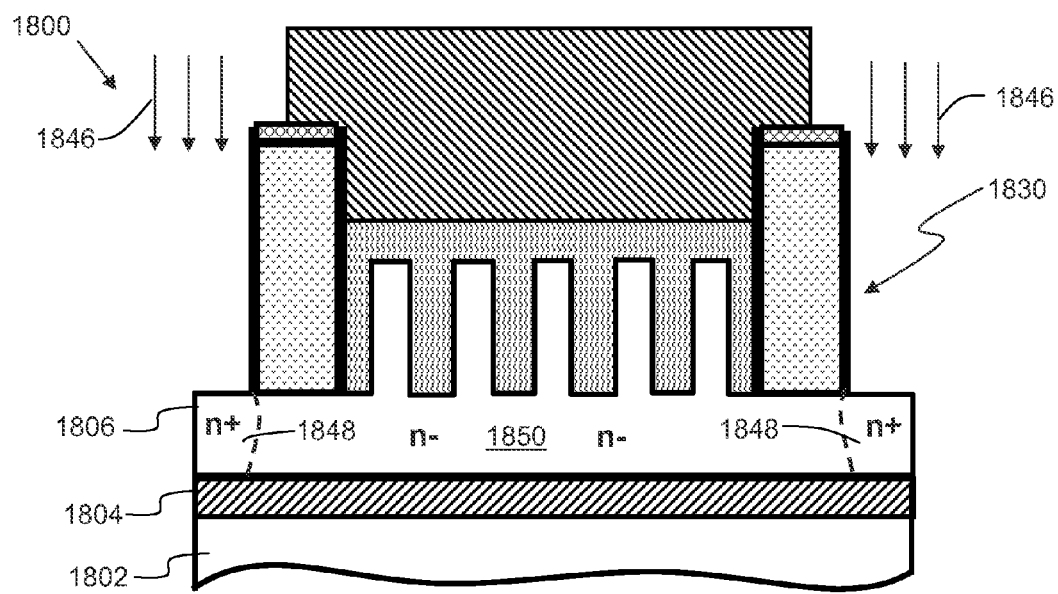

FIG. 18 shows a subsequent process step of implantation outside of the diode region.

Figure 18A:
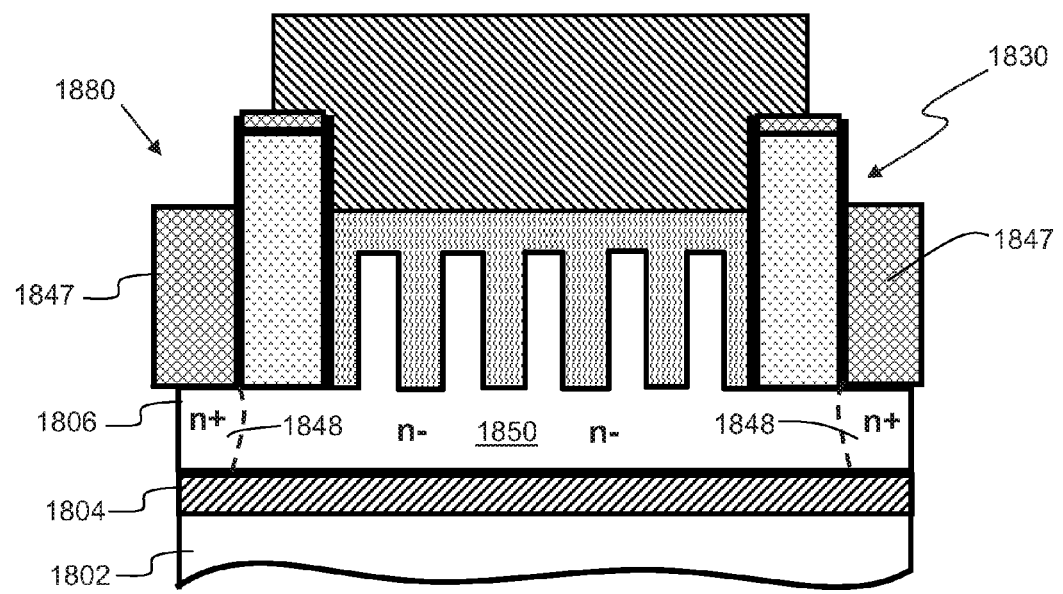

FIG. 18A shows a subsequent process step of doping outside the diode region for an alternative embodiment.

Figure 18B:
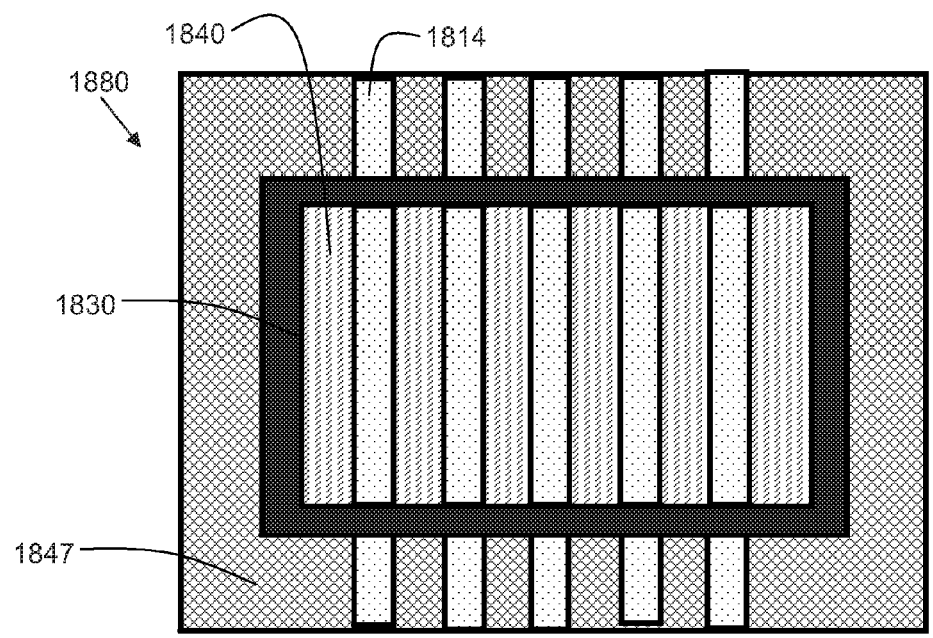

FIG. 18B shows a top-down view of the embodiment of FIG. 18A.

Figure 19:
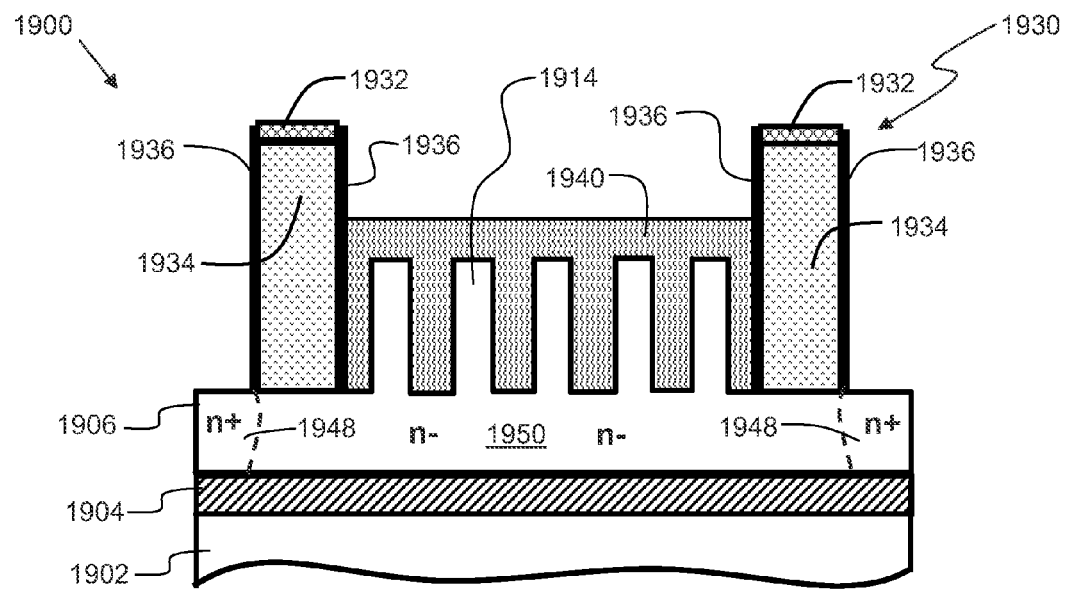

FIG. 19 shows a diode in accordance with an embodiment of the present invention.

Figure 20:
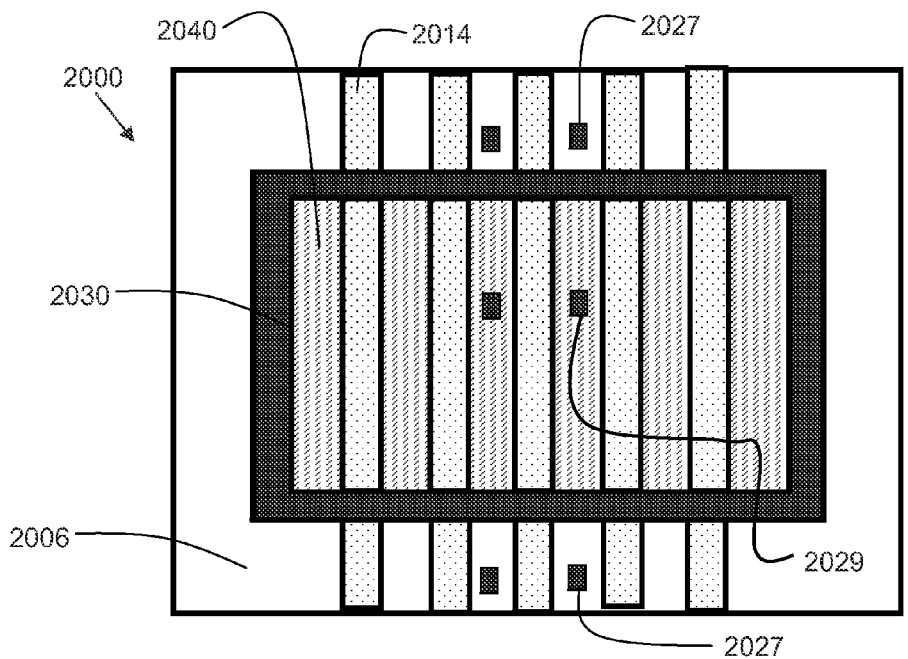

FIG. 20 shows another embodiment of a semiconductor structure in accordance with an embodiment of the present invention.

Figure 21:
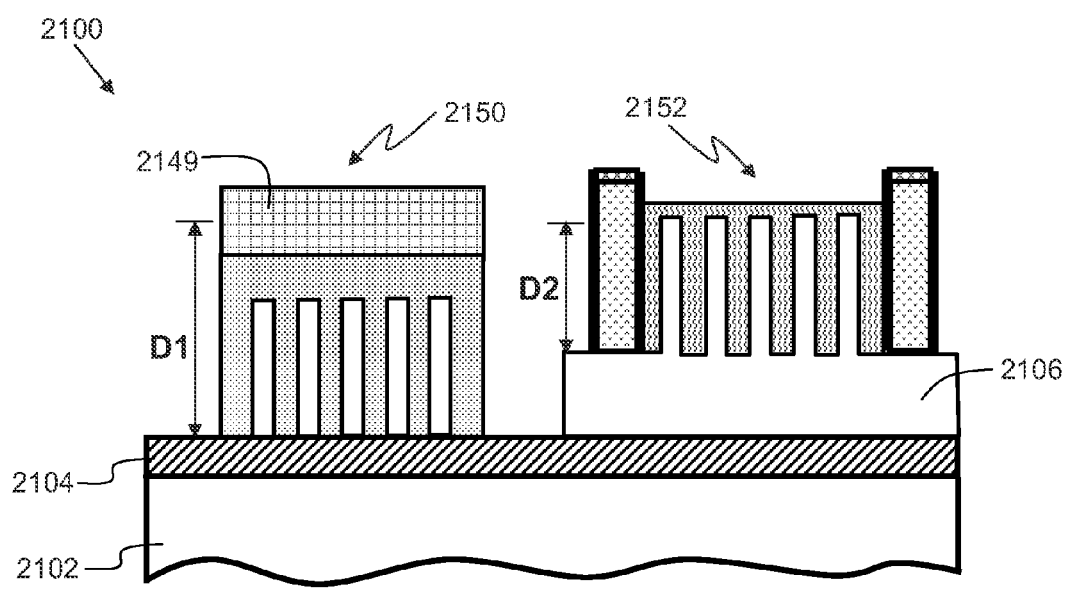

FIG. 21 shows yet another embodiment of a semiconductor structure in accordance with an embodiment of the present invention.

Figure 22:
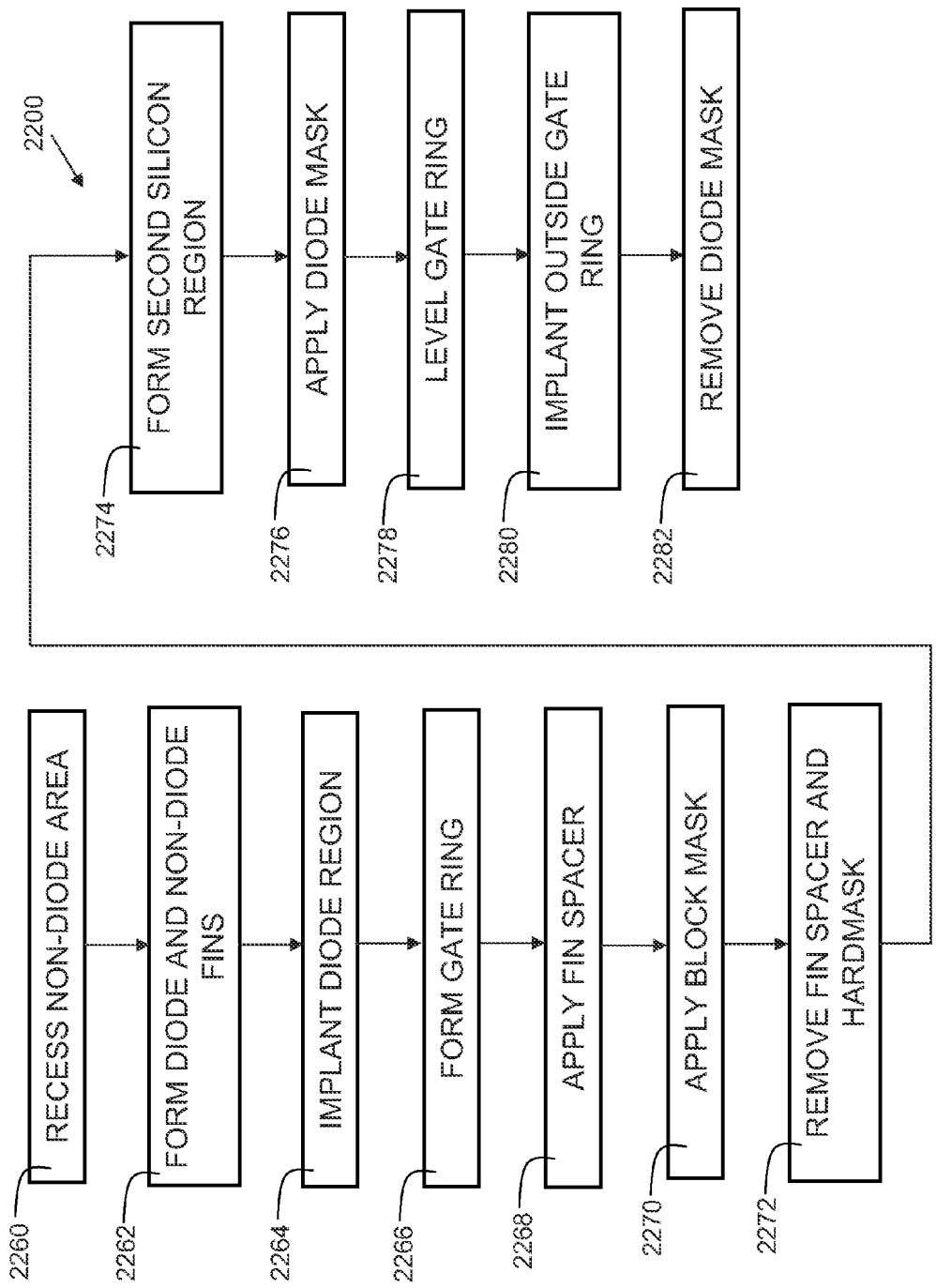

FIG. 22 is a flowchart indicating process steps for an embodiment of the present invention.

Figure 23:
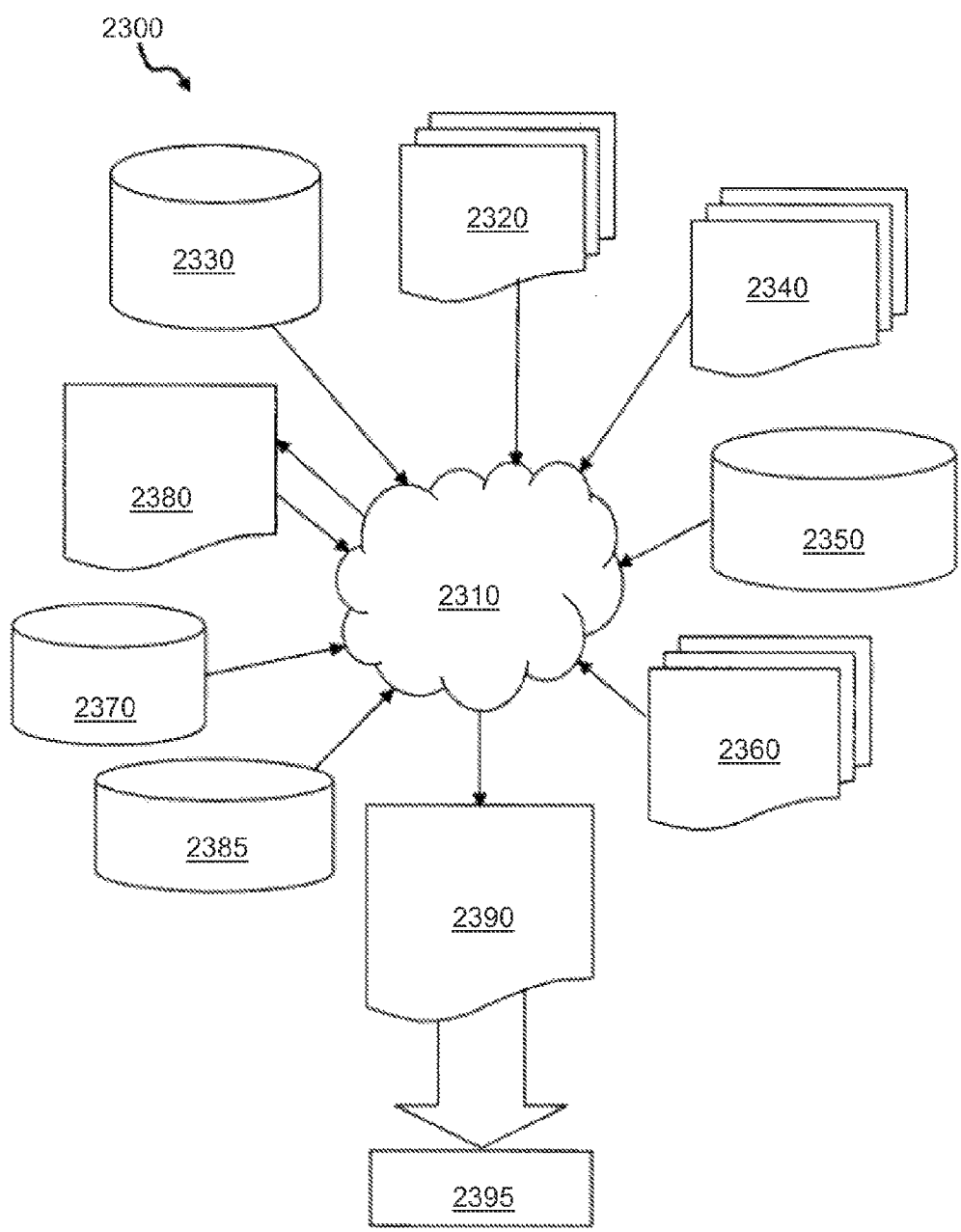

FIG. 23 shows a block diagram of an exemplary design flow. \

DETAILED DESCRIPTION

FIG. 1 shows a starting point for a method in accordance with an embodiment of the present invention. Semiconductor structure 100 is a silicon-on-insulator (SOI) structure comprising bulk silicon layer 102, buried oxide (BOX) layer 104 which serves as an insulator layer, disposed on the bulk silicon layer 102, and top silicon layer 106 disposed on the BOX layer 104. Top silicon layer 106 has a depth D1 which is selected to be larger than the final fin height. In one embodiment, the depth D1 ranges from about 60 nanometers to about 200 nanometers. In subsequent processing steps, a non-diode portion of the semiconductor structure is recessed to a depth of D1, which exposes the BOX layer 104. In a diode portion, the semiconductor structure is recessed to a depth of D2, where D1>D2. In one embodiment, D2 ranges from about 30 nanometers to about 170 nanometers, and is less than D1. In the diode portion, the fins terminate on the silicon layer 106 instead of on the BOX layer 104. This provides additional surface area for the diode fins, which makes the diode more resilient to ESD events.

FIG. 2 shows a semiconductor structure 200 after a subsequent process step of applying a nitride layer 208. As stated previously, often, similar elements may be referred to by similar numbers in various figures (FIGs) of the drawing, in which case typically the last two significant digits may be the same, the most significant digit being the number of the drawing figure (FIG). Hence, silicon substrate 202 of FIG. 2 is similar to silicon substrate 102 of FIG. 1, and BOX layer 204 of FIG. 2 is similar to BOX layer 104 of FIG. 1, for example.

The nitride layer 208 is used to protect portions of the semiconductor structure during subsequent processing steps. In one embodiment, silicon nitride is used for nitride layer 208. In one embodiment, the nitride layer 208 is deposited via chemical vapor deposition, and has a thickness ranging from about 10 nanometers to about 50 nanometers.

FIG. 3 shows a semiconductor structure 300 after a subsequent process step of applying resist 310 to the diode region. This may be done via standard lithographic techniques. The resist region 310 is disposed over the diode portion of the semiconductor structure 300. The part of semiconductor structure 300 where resist is not applied (indicated as 311) is the non-diode portion of the semiconductor structure. The resist region 310 may be applied via industry-standard lithographic patterning techniques.

FIG. 4 shows a semiconductor structure 400 after subsequent process steps of removing nitride from the non-diode region and removing the resist (compare with 310 of FIG. 3). A portion of the nitride 408 remains over the diode region of the semiconductor structure 400. The resist may be removed via industry-standard techniques such as a wet etch.

FIG. 5 shows a semiconductor structure 500 after a subsequent process step of recessing the non-diode region to a depth Dn. Resist region 508 protects the diode portion of the semiconductor structure 500 from etching. Hence, resist region 508 is disposed on a non-recessed portion, and the other side is the recessed portion, which is recessed to a depth of Dn. In one embodiment, the recessing of the non-diode region is performed via a reactive ion etch (RIE). In another embodiment, a combination of forming a sacrificial oxidation layer followed by an HF etch is used to create the recess. In one embodiment, the depth Dn ranges from about 5 nanometers to about 60 nanometers.

FIG. 6 shows a semiconductor structure 600 after a subsequent process step of applying a fin-top protective layer 612. In one embodiment, the fin-top protective layer is comprised of nitride. In another embodiment, the fin-top protective layer is comprised of oxide (a fin-top oxidation layer). Fin-top protective layer 612 may serve as a fin hardmask during subsequent processing steps.

FIG. 7 shows a semiconductor structure 700 after a subsequent process step of fin formation. Semiconductor structure 700 is comprised of diode portion 722 and non-diode portion 720. Non-diode portion 720 comprises fins 714 which are disposed on BOX layer 704. Diode portion 722 comprises fins 715 which are similar to fins 714, except that fins 715 are disposed on silicon layer 706. Hence, fins 715 terminate on silicon layer 706 whereas fins 714 terminate on BOX layer 704. Each fin is comprised of a silicon portion (shown generally as 718), and a hardmask portion (shown generally as 716). The hardmask portion may come from the fin-top protective layer 612 shown in FIG. 6. The semiconductor structure 700 may therefore be comprised of a non-diode portion 720 disposed adjacent to a diode portion 722. The non-diode portion 720 may comprise a FinFET, a resistor, or other device.

FIG. 8 shows a semiconductor structure 800 after a subsequent process step of diode implantation. A masking layer 824 is disposed over the non-diode fins 814 using industry-standard lithographic and patterning techniques. Dopants (indicated by arrow 826) are implanted into the silicon layer 806. In one embodiment, the dopants are comprised of arsenic or phosphorous. In another embodiment, boron may be used. In some embodiments, the dopant concentration ranges from about 10E15 atoms/$cm^3$ to about 10E17 atoms/$cm^3$.

FIG. 9A shows a top down view of the diode region of a semiconductor structure 900 after fin formation. A plurality of fins, indicated generally as 914 are disposed on silicon layer 906. FIG. 9B shows a cross section of the diode region along the line A-A' indicated in FIG. 9A. Each fin 914 has a silicon portion 918 and has a hardmask portion 916 disposed on the silicon portion 918. The silicon portion 918 and silicon layer 906 are part of the same substrate. In one embodiment, the thickness of the fin Tfin ranges from about 5 nanometers to about 15 nanometers. The height of the silicon portion 918, indicated as Hfin, ranges from about 20 nanometers to about 120 nanometers. In one embodiment, the pitch Pfin, which is the distance between midpoints of two adjacent fins, ranges from about 30 nanometers to about 80 nanometers. Each fin 914 is connected to an adjacent fin by inter-fin silicon region 917. This increases the silicon surface area as well as the silicon volume, which makes the device more resilient to ESD events.

FIG. 10A shows a top-down view of the diode region of a semiconductor structure 1000 after a subsequent process step of formation of a gate ring 1030. The gate ring 1030 is comprised of gate material, such as polysilicon, and forms a closed shape, such as a rectangle, and a portion of the fins 1014 are enclosed by the gate ring. The gate ring is disposed on silicon layer 1006. FIG. 10B shows a cross section view of the diode region along the line B-B' indicated in FIG. 10A. As shown in the cross section view of FIG. 10B, the gate ring 1030 is comprised of gate material, such as polysilicon region 1034, and a hardmask layer 1032 disposed on the polysilicon region 1034. The gate ring serves to allow creation of a more heavily doped region outside of the fin area, as will be shown in the upcoming figures.

FIG. 11 shows a semiconductor structure 1100 after a subsequent process step of spacer deposition. The spacer material 1136 is disposed on the gate ring 1130 and the fins 1114. The spacer material may be comprised of nitride, and may be deposited by any suitable method, such as chemical vapor deposition (CVD).

FIG. 12A shows a top-down view of the diode region of a semiconductor structure 1200 after a subsequent process step of applying a block mask 1238. The block mask 1238 is open in the center, exposing spacer material 1236, which covers the fins 1214 and the substrate 1206 (see FIG. 12B) on which the fins are disposed. FIG. 12B shows a cross section view of the diode region along the line C-C' indicated in FIG. 12A. The block mask may be comprised of photoresist, or other suitable protective material.

FIG. 13 shows a semiconductor structure 1300 after a subsequent process step of fin spacer removal. The spacer etch may be performed via a directional pull-down etch which removes the amount of spacer material necessary to completely remove spacer material from the fins. Since the gate ring hardmask 1332 is taller than the fins 1314, a portion of the spacer material, indicated as 1336, remains on gate ring 1330. The hardmask layer 1332 is partially etched, but is not completely removed, so that the polysilicon portion 1334 of the gate ring 1330 is not exposed.

FIG. 14 shows a semiconductor structure 1400 after a subsequent process step of block mask removal (compare with 1338 of FIG. 13). The block mask may be removed via a wet etch process.

FIG. 15A shows a top-down view of the diode region of a semiconductor structure 1500 after a subsequent process step of forming a second silicon layer 1540. The second silicon layer 1540 may be a P doped epitaxial silicon, or silicon-containing compound, such as silicon-germanium (SiGe), or boron-silicon-germanium (BSiGe). The term "P doped" denotes a P-type dopant, such as boron, for example.

FIG. 15B shows a cross section view of the diode region along the line D-D' indicated in FIG. 15A. The second silicon layer 1540 may be P doped with boron, and may be doped in situ. In one embodiment, a BiSiGe material is used for second silicon layer 1540. The silicon layer 1506 is lightly N doped (refer to FIG. 8), and hence, first silicon layer 1506 and second silicon layer 1540 are doped oppositely to each other, and form a P-N junction for the diode. By having the fins 1514 disposed on silicon layer 1506 (instead of terminating on the BOX layer like fins 714 of FIG. 7), the junction area and total silicon volume are increased, which makes the diode more tolerant of ESD events.

FIG. 16 shows a semiconductor structure 1600 after a subsequent process step of applying a diode mask 1642. The diode mask 1642 may be comprised of photoresist, or other suitable protective material.

FIG. 17 shows a semiconductor structure 1700 after a subsequent process step of gate ring leveling. This may be performed via a second directional pull-down etch. As a result of gate ring leveling, hardmask region 1732 is relatively planar, although a hardmask bump or dip could remain.

FIG. 18 shows a semiconductor structure 1800 after a subsequent process step of implantation outside of the diode region. Dopants (indicated by arrows 1846) are implanted into the outer regions 1848 of silicon layer 1806. Outer regions 1848 are disposed outside of, and adjacent to, gate ring 1830. The dopant concentration in regions 1848 is higher than in region 1850. In one embodiment, the dopant concentration in regions 1848 ranges from about 10E18 atoms/cm$^3$ to 10E19 atoms/cm3. Hence, region 1850 is n− (lightly N doped) and regions 1848 are n+ (heavily N doped). In one embodiment, the dopant for regions 1848 may be arsenic or phosphorous. The doped regions 1848 serve to reduce device resistance.

FIG. 18A shows a semiconductor structure 1880 after a subsequent process step of doping outside the diode region for an alternative embodiment. In this embodiment, an in situ phosphorous doped silicon epitaxial (ISPD epi) region 1847 is grown outside of the gate ring 1830 and disposed on silicon layer 1806. The ISPD epi regions serve to get the desired dopants in the outer regions 1848 via diffusion.

FIG. 18B shows a top down view of semiconductor structure 1880. In this view, the ISPD epi region 1847 is shown as surrounding the gate ring 1830, such that outside the gate ring is ISPD epi region 1847, and inside the gate ring is second silicon layer 1840. Silicon layer 1840 may be a P doped epitaxial layer.

FIG. 19 shows a semiconductor structure 1900 comprising a diode in accordance with an embodiment of the present invention. The diode mask is removed (compare 1642 of FIG. 16). The diode mask may be removed with an industry-standard mask removal process, such as a selective etch. From this point forward, standard semiconductor processing may be used to complete the integrated circuit. The inventive methods discussed herein are compatible with replacement metal gate (RMG) processes. In the case of a "gate last" or RMG process, the gate ring may be comprised of the gate metal when the fabrication of the semiconductor is complete.

FIG. 20 shows a top-down view of another embodiment of a semiconductor structure in accordance with an embodiment of the present invention. In this view, inner contacts 2029 and outer contacts 2027 are indicated. Inner contacts 2029 are located inside gate ring 2030, and outer contacts 2027 are located outside of gate ring 2030. The current flow through the diode is from the center contacts 2029 to the outer contacts 2027. The inner contacts 2029 are disposed on P doped silicon region 2040 and the outer contacts 2027 are disposed on N− doped silicon region 2006. In one embodiment, the inner contacts 2029 and outer contacts 2027 are comprised of tungsten. In another embodiment, the inner contacts 2029 and outer contacts 2027 are comprised of copper.

FIG. 21 shows a semiconductor structure 2100 in accordance with another embodiment of the present invention. Semiconductor structure 2100 comprises a FinFET 2150 formed adjacent to a diode 2152. FinFET 2150 has a gate 2149. The diode 2152 is formed on silicon layer 2106, whereas the adjacent FinFET 2150 is disposed directly on BOX layer 2104. Thus, a diode with improved ESD tolerance is fabricated adjacent to a FinFET. It can now be seen that the bottom of the FinFET 2150 is at a depth D1 from the original substrate surface, and the bottom of the diode 2152 is at a depth D2 from the original substrate surface (compare with FIG. 1).

FIG. 22 is a flowchart indicating process steps for an embodiment of the present invention. In process step 2260, a non-diode area is recessed. This step is shown in FIG. 5 (see Dn). In process step 2262, diode and non-diode fins are formed. This is shown in FIG. 7 (non-diode fins 714 and diode fins 715). In process step 2264, the diode region is implanted to make it lightly N– doped. This is shown in FIG. 8 (see 826). In process step 2266 a gate ring is formed. This is shown in FIGS. 10A and 10B (see 1030). In process step 2268 a fin spacer is applied. This is shown in FIG. 11 (see 1136). In process step 2270 a block mask is applied. This is shown in FIGS. 12A and 12B (see 1238). In process step 2272 the fin spacer and fin hardmask are removed. This is shown in FIG. 14. In process step 2274 a second silicon region is formed. This may be a P doped region, and may be epitaxially grown. This is shown in FIG. 15B (see 1540). In process step 2276 a diode mask is applied. This is shown in FIG. 16 (see 1642). In process step 2278 the gate ring is leveled. This is shown in FIG. 17 (see 1732). In process step 2280 the outside of the gate ring is doped N+. This is shown in FIG. 18 (see 1848 and 1850). In process step 2282 the diode mask is removed. This is shown in FIG. 19 (compare with 1642 of FIG. 16). In subsequent processing steps, contacts may be formed, such as those shown in FIGS. 20 (2027 and 2029).

FIG. 23 shows a block diagram of an exemplary design flow 2300 used for example, in semiconductor IC logic design, simulation, test, layout, and manufacture. Design flow 2300 includes processes, machines and/or mechanisms for processing design structures or devices to generate logically or otherwise functionally equivalent representations of the design structures and/or devices described above and shown in FIGS. 1-22. The design structures processed and/or generated by design flow 2300 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 2300 may vary depending on the type of representation being designed. For example, a design flow 2300 for building an application specific IC (ASIC) may differ from a design flow 2300 for designing a standard component or from a design flow 2300 for instantiating the design into a programmable array, for example a programmable gate array (PGA) or a field programmable gate array (FPGA) offered by Altera® Inc. or Xilinx® Inc.

FIG. 23 illustrates multiple such design structures including an input design structure 2320 that is preferably processed by a design process 2310. Design structure 2320 may be a logical simulation design structure generated and processed by design process 2310 to produce a logically equivalent functional representation of a hardware device. Design structure 2320 may also or alternatively comprise data and/or program instructions that when processed by design process 2310, generate a functional representation of the physical structure of a hardware device. Whether representing functional and/or structural design features, design structure 2320 may be generated using electronic computer-aided design (ECAD) such as implemented by a core developer/designer. When encoded on a machine-readable data transmission, gate array, or storage medium, design structure 2320 may be accessed and processed by one or more hardware and/or software modules within design process 2310 to simulate or otherwise functionally represent an electronic component, circuit, electronic or logic module, apparatus, device, or system such as those shown in FIGS. 1-22. As such, design structure 2320 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 2310 preferably employs and incorporates hardware and/or software modules for synthesizing, translating, or otherwise processing a design/simulation functional equivalent of the components, circuits, devices, or logic structures shown in FIGS. 1-22 to generate a Netlist 2380 which may contain design structures such as design structure 2320. Netlist 2380 may comprise, for example, compiled or otherwise processed data structures representing a list of wires, discrete components, logic gates, control circuits, I/O devices, models, etc. that describes the connections to other elements and circuits in an integrated circuit design. Netlist 2380 may be synthesized using an iterative process in which netlist 2380 is resynthesized one or more times depending on design specifications and parameters for the device. As with other design structure types described herein, netlist 2380 may be recorded on a machine-readable data storage medium or programmed into a programmable gate array. The medium may be a non-transitory, non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 2310 may include using a variety of inputs; for example, inputs from library elements 2330 which may house a set of commonly used elements, circuits, and devices, including models, layouts, and symbolic representations, for a given manufacturing technology (e.g., different technology nodes, 32 nm, 45 nm, 90 nm, etc.), design specifications 2340, characterization data 2350, verification data 2360, design rules 2370, and test data files 2385 (which may include test patterns and other testing information). Design process 2310 may further include, for example, standard circuit design processes such as timing analysis, verification, design rule checking, place and route operations, etc. One of ordinary skill in the art of integrated circuit design can appreciate the extent of possible electronic design automation tools and applications used in design process 2310 without deviating from the scope and spirit of the invention. The design structure of the invention is not limited to any specific design flow.

Design process 2310 preferably translates an embodiment of the invention as shown in FIGS. 1-22, along with any additional integrated circuit design or data (if applicable), into a second design structure 2390. Design structure 2390 resides on a storage medium in a data format used for the exchange of layout data of integrated circuits (e.g. information stored in a GDSII (GDS2), GL1, OASIS, or any other suitable format for storing such design structures). Design structure 2390 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as described above with reference to FIGS. 1-22. Design structure 2390 may then proceed to a stage 2395 where, for example, design structure 2390: proceeds to tape-out, is released to manufacturing, is released to a mask house, is sent to another design house, is sent back to the customer, etc.

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

What is claimed is:

1. A method of forming a diode on a semiconductor structure, the structure comprised of a first silicon layer disposed on an insulator layer, the method comprising:
    forming a plurality of diode fins on a diode portion of the semiconductor structure, wherein the plurality of fins terminate on the first silicon layer;
    implanting dopants on the plurality of diode fins and first silicon layer;
    forming a gate ring on the semiconductor structure;
    forming a second silicon layer, disposed within the gate ring, and on the plurality of diode fins, and
    doping the second silicon layer oppositely to the first silicon layer.

2. The method of claim 1, wherein implanting dopants on the plurality of diode fins and first silicon layer comprises implanting dopants selected from the group consisting of arsenic and phosphorous.

3. The method of claim 2, further comprising forming a plurality of fins in a non-diode portion of the semiconductor structure.

4. The method of claim 2, further comprising:
    recessing a non-diode portion of the semiconductor structure, thereby forming a recessed portion and a non-recessed portion; and
    forming a protective layer disposed on recessed portion and non-recessed portion of the semiconductor structure.

5. The method of claim 4, wherein forming a protective layer comprises depositing a nitride layer.

6. The method of claim 4, wherein forming a protective layer comprises forming a fin-top oxidation layer.

7. The method of claim 4, wherein recessing a non-diode portion of the semiconductor structure is performed by a reactive ion etch process.

8. The method of claim 2, wherein recessing a non-diode portion of the semiconductor structure is performed by:
    forming a sacrificial oxidation layer on the non-diode portion of the semiconductor structure; and
    removing the sacrificial oxidation layer with a wet etch process.

9. The method of claim 1, further comprising:
    providing dopants in an outer region of the first silicon layer, wherein the dopant concentration in the outer region is greater than the dopant concentration in the diode portion of the first silicon layer.

10. The method of claim 9, wherein providing dopants in an outer region of the first silicon layer comprises forming an in situ phosphorous doped silicon epitaxial region disposed on the first silicon layer, outside of the gate ring.

11. The method of claim 1, wherein forming a second silicon layer, disposed within the gate ring, and on the plurality of fins in the diode portion, comprises forming an epitaxial in-situ P doped silicon layer.

\* \* \* \* \*